United States Patent
Suzuki (10) Patent No.: US 10,414,977 B2
(45) Date of Patent: Sep. 17, 2019

(54) FLUORESCENT MATERIAL HAVING COMPOSITION OF RARE EARTH ALUMINUM-GALLATE, AND LIGHT EMITTING DEVICE

(71) Applicant: NICHIA CORPORATION, Anan-shi, Tokushima (JP)

(72) Inventor: Tomokazu Suzuki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/982,427

(22) Filed: May 17, 2018

(65) Prior Publication Data

US 2018/0334617 A1  Nov. 22, 2018

(30) Foreign Application Priority Data

May 19, 2017 (JP) .................... 2017-100133

(51) Int. Cl.
*H01L 29/22* (2006.01)
*C09K 11/77* (2006.01)
*H01L 33/50* (2010.01)

(52) U.S. Cl.
CPC ........ *C09K 11/7792* (2013.01); *H01L 33/502* (2013.01)

(58) Field of Classification Search
CPC ............ H01L 31/0272; C04B 2111/807; H01J 2211/42; C09K 11/00; C09K 11/08; C09K 11/706
USPC ........................................................ 428/690
See application file for complete search history.

(56) References Cited

U.S. PATENT DOCUMENTS

| 6,717,349 B2 | 4/2004 | Wang et al. |
| 7,147,803 B2 | 12/2006 | Wang et al. |
| 8,339,025 B2 | 12/2012 | Nakamura et al. |
| 2002/0180338 A1 | 12/2002 | Wang et al. |
| 2004/0258599 A1 | 12/2004 | Wang et al. |
| 2007/0103057 A1 | 5/2007 | Sohn et al. |
| 2010/0301739 A1 | 12/2010 | Nakamura et al. |
| 2013/0134865 A1 | 5/2013 | Chuang et al. |
| 2017/0342322 A1* | 11/2017 | Suzuki ............... C09K 11/7774 |

FOREIGN PATENT DOCUMENTS

| CN | 1616596 A | 5/2005 |
| EP | 1501909 B1 | 2/2008 |
| JP | 2002363555 A | 12/2002 |
| JP | 2005524737 A | 8/2005 |
| JP | 2006233158 A | 9/2006 |
| JP | 2007126670 A | 5/2007 |
| JP | 2007161942 A | 6/2007 |
| JP | 2012528920 A | 11/2012 |
| JP | 20131128118 A | 6/2013 |

* cited by examiner

*Primary Examiner* — Hsien Ming Lee
(74) *Attorney, Agent, or Firm* — Hunton Andrews Kurth LLP (57) ABSTRACT

Provided are a fluorescent material and a light emitting device using the fluorescent material. The fluorescent material has a composition represented by the following formula (I):

$$(Ln_{1-a-b-c}Tb_aCe_bEu_c)_3(Al_{1-d}Ga_d)_5O_{12} \qquad (I)$$

wherein Ln represents at least one rare earth element selected from the group consisting of Y, Gd, La, Lu, Sc and Sm, and parameters a, b, c and d satisfy $0.25 \leq a < 1$, $0.008 \times 10^{-2} \leq b \leq 1.5 \times 10^{-2}$, $0.012 \times 10^{-2} \leq c \leq 2 \times 10^{-2}$, and $0 \leq d \leq 0.85$.

7 Claims, 6 Drawing Sheets

FLUORESCENT MATERIAL HAVING COMPOSITION OF RARE EARTH ALUMINUM-GALLATE, AND LIGHT EMITTING DEVICE

CROSS-REFERENCE TO RELATED PATENT APPLICATION

This application claims priority to Japanese Patent Application No. 2017-100133, filed on May 19, 2017, the entire disclosure of which is incorporated herein by reference in its entirety.

BACKGROUND

Technical Field

The present disclosure relates to a fluorescent material having a composition of a rare earth aluminum-gallate, and a light emitting device using the same. In this specification, the "fluorescent material" is used in the same meaning as a "fluorescent phosphor".

Description of Related Art

A variety of light emitting devices including a light source, such as a light emitting diode (LED) chip, in combination with a fluorescent material have been developed. For example, a light emitting device emitting a white color through a combination of an LED chip emitting blue light with a fluorescent material emitting yellow light has been developed. As a fluorescent material that emits yellow light when excited by receiving blue light from an LED chip, a rare earth aluminate fluorescent material activated by cerium having a garnet structure, for example, $Y_3Al_5O_{12}$:Ce (YAG: yttrium aluminium garnet) is known.

White emission from a combination of an LED chip to emit blue light and a YAG fluorescent material represented by $Y_3Al_5O_{12}$:Ce that emits yellow light by receiving blue light is weak in red color emission. For compensating red color emission, a light emitting device combined with a red color-emitting fluorescent material represented by $CaAlSiN_3$:Eu, $K_2SiF_6$:Mn, or $3.5MgO.0.5MgF_2.GeO_2$:Mn is also known.

For compensating a red component in which a YAG fluorescent material represented by $Y_3Al_5O_{12}$:Ce is poor, for example, in Japanese Unexamined Patent Publication No. 2002-363555, Japanese Unexamined Patent Publication No. 2006-233158, and Japanese Unexamined Patent Publication No. 2007-126670 respectively propose fluorescent materials having a composition of a rare earth aluminum-gallate in which the kind of the element to be an activator or the molar ratio of the element to be an activator is changed.

SUMMARY

However, as the case may be, some fluorescent materials having a composition of a rare earth aluminum-gallate disclosed in Japanese Unexamined Patent Publication No. 2002-363555, Japanese Unexamined Patent Publication No. 2006-233158, and Japanese Unexamined Patent Publication No. 2007-126670 could not provide emission capable of compensating the desired reddish emission.

An object of the present disclosure is to provide a fluorescent material having a composition of a rare earth aluminum-gallate in which a red component has been reinforced and which has a high emission intensity, and to provide a light emitting device using the fluorescent material.

For solving the above-mentioned problems, the present disclosure includes the following embodiments.

A first embodiment of the present disclosure relates to a fluorescent material having a composition of a rare earth aluminum-gallate, which contains at least one rare earth element Ln selected from the group consisting of Y, Gd, La, Lu, Sc and Sm; at least one Group 13 element selected from Al and Ga; Tb; Ce; and Eu, and wherein when a total molar ratio of Al and Ga is set to 5, the total molar ratio of Ln, and Tb, Ce and Eu is 3, the molar ratio of Tb is a product of 3 and a parameter a, the molar ratio of Ce is a product of 3 and a parameter b, the molar ratio of Eu is a product of 3 and a parameter c, the molar ratio of Ga is a product of 5 and a parameter d, the parameter a is 0.25 or more and less than 1, the parameter b is $0.008 \times 10^{-2}$ or more and $1.5 \times 10^{-2}$ or less, the parameter c is $0.012 \times 10^{-2}$ or more and $2 \times 10^{-2}$ or less, and the parameter d is 0 or more and 0.85 or less.

A second aspect of the present invention is a light emitting device containing the fluorescent material and an excitation light source.

According to the embodiments of the present disclosure, there can be provided a fluorescent material having a composition of a rare earth aluminum-gallate in which a red component has been reinforced and which has a high light emission intensity, and a light emitting device using the fluorescent material.

DETAILED DESCRIPTION

The fluorescent material and the light emitting device according to the present invention are described hereunder on the basis of embodiments. The embodiments as shown below are exemplifications for exemplifying the technical concept of the present invention, and the present invention is not limited to the fluorescent materials and the light emitting devices shown below. The relationship between the color name and the chromaticity coordinate, the relationship between the wavelength range of light and the color name of monochromic light are in accordance with JIS Z8110.

The first embodiment of the present disclosure is a fluorescent material having a composition of a rare earth aluminum-gallate, which contains at least one rare earth element Ln selected from the group consisting of Y, Gd, La, Lu, Sc and Sm; at least one Group 13 element selected from Al and Ga; Tb; Ce; and Eu. When a total molar ratio of Al and Ga is set to 5, a total molar ratio of Ln, and Tb, Ce and Eu is 3, a molar ratio of Tb is a product of 3 and a parameter a, a molar ratio of Ce is a product of 3 and a parameter b, a molar ratio of Eu is a product of 3 and a parameter c, a molar ratio of Ga is a product of 5 and a parameter d. The parameter a is 0.25 or more and less than 1. The parameter b is $0.008 \times 10^{-2}$ or more and $1.5 \times 10^{-2}$ or less. The parameter c is $0.012 \times 10^{-2}$ or more and $2 \times 10^{-2}$ or less. The parameter d is 0 or more and 0.85 or less.

The fluorescent material of the first embodiment contains, as essential elements, at least one rare earth element Ln selected from the group consisting of Y, Gd, La, Lu, Sc and Sm; at least one Group 13 element selected from aluminum (Al) and gallium (Ga); and in addition to oxygen (O), three kinds of elements of terbium (Tb), cerium (Ce) and europium (Eu), which constitute a crystal structure of a rare earth aluminum-gallate. The fluorescent material having the composition of a rare earth aluminum-gallate contains three kinds of lanthanoid elements Tb, Ce and Eu each in a predetermined amount. In the fluorescent material, therefore, a part of the rare earth elements constituting a garnet-type crystal structure are substituted with three elements of Tb, Ce and Eu to reinforce a red color component, and accordingly, the material provides light emission owing to the light from an excitation light source. In the light emission spectrum of the material, a sharp and strong light emission peak appears at around a wavelength of 591 nm, and thus the material has a high light emission intensity. The rare earth element Ln constituting the composition of the rare earth aluminum-gallate of the fluorescent material is preferably at least one selected from the group consisting of Y, Gd, La, Lu and Sc.

The fluorescent material having a composition of a rare earth aluminum-gallate preferably has a composition represented by the following formula (I):

(I)

wherein Ln represents at least one rare earth element selected from the group consisting of Y, Gd, La, Lu, Sc and Sm, and parameters a, b, c and d are numbers satisfying $0.25 \le a < 1$, $0.008 \times 10^{-2} \le b \le 1.5 \times 10^{-2}$, $0.012 \times 10^{-2} \le c \le 2 \times 10^{-2}$, and $0 \le d \le 0.85$, respectively.

In the composition of a rare earth aluminum-gallate for the fluorescent material, when the total molar ratio of Al and Ga is set to 5, the total molar ratio of the rare earth element Ln, and Tb, Ce and Eu is 3, and the molar ratio of Tb is a product of 3 and a parameter a, the parameter a indicating the amount of Tb is 0.25 or more and less than 1, preferably 0.3 or more and less than 1, more preferably 0.35 or more and less than 1, even more preferably 0.35 or more and 0.9998 or less. In the composition of a rare earth aluminium gallate, when the parameter a is less than 0.25, the light emission intensity at around a wavelength of 591 nm is low.

In the fluorescent material, Tb functions as one light emission center. In the composition of a rare earth aluminum-gallate, the parameter a indicating the amount of Tb is 0.25 or more and less than 1, and therefore owing to energy transfer from Ce to Tb, a sharp and strong light emission peak appears at around a wavelength of 591 nm in the light emission spectrum. On the other hand, in the light emission spectrum of a YAG fluorescent material having Ce as a single activator or a YAG fluorescent material having two activators of Ce and Eu, a broad peak appears, having a light emission peak in a wavelength region for light emission in yellowish green to yellow.

In the composition of a rare earth aluminum-gallate for the fluorescent material, when the total molar ratio of Al and Ga is set to 5, the total molar ratio of the rare earth element Ln, and Tb, Ce and Eu is 3, and the molar ratio of Ce is a product of 3 and a parameter b, the parameter b indicating the amount of Ce is $0.008 \times 10^{-2}$ or more and $1.5 \times 10^{-2}$ or less, preferably $0.01 \times 10^{-2}$ or more and $0.95 \times 10^{-2}$ or less, more preferably $0.015 \times 10^{-2}$ or more and $0.7 \times 10^{-2}$ or less. In the composition of a rare earth aluminium gallate, when the parameter b is less than $0.008 \times 10^{-2}$ or more than $1.5 \times 10^{-2}$, the light emission intensity at around a wavelength of 591 nm is low.

In the fluorescent material, Ce functions as one light emission center. In the composition of a rare earth aluminum-gallate for the fluorescent material, when the parameter b indicating the amount of Ce is $0.008 \times 10^{-2}$ or more and $1.5 \times 10^{-2}$ or less and when the composition contains two elements Tb and Eu in addition to Ce, a sharp and strong light emission peak can appear at around a wavelength of 591 nm, while a fluorescent material having Ce as a single activator shows a broad peak having a peak top at around a wavelength of 550 nm, in the light emission spectrum.

In the composition of a rare earth aluminum-gallate for the fluorescent material, when the total molar ratio of Al and Ga is set to 5, the total molar ratio of the rare earth element Ln, and Tb, Ce and Eu is 3, and the molar ratio of Eu is a product of 3 and a parameter c, the parameter c indicating the amount of Eu is $0.012 \times 10^{-2}$ or more and $2 \times 10^{-2}$ or less, preferably $0.014 \times 10^{-2}$ or more and $1.6 \times 10^{-2}$ or less, more preferably $0.02 \times 10^{-2}$ or more and $1.2 \times 10^{-2}$ or less. In the composition of a rare earth aluminum-gallate, when the parameter c is less than $0.012 \times 10^{-2}$ or more than $2 \times 10^{-2}$, the light emission intensity at around a wavelength of 591 nm is low.

In the composition of a rare earth aluminum-gallate, Eu functions as one light emission center. In the composition of a rare earth aluminum-gallate for the fluorescent material, when the parameter c indicating the amount of Eu is $0.012 \times 10^{-2}$ or more and $2 \times 10^{-2}$ or less and when the composition contains Tb and Eu in addition to Ce, a sharp and strong light emission peak can appear in the light emission spectrum at around a wavelength of 591 nm, while a fluorescent material having Ce as a single activator shows a broad peak having a peak top at around a wavelength of 550 nm, owing to energy transfer from Ce to Eu and Tb.

For the fluorescent material of the first embodiment of the present disclosure, preferably, the composition of a rare earth aluminum-gallate contains Ga. In general, it is known that, in a YAG fluorescent material having a garnet structure, Ga is substituted with a site of Al in the crystal structure, and therefore the crystal structure becomes unstable and the light emission intensity lowers. Contrary to this general knowledge, the present inventors have found that when the composition of a rare earth aluminum-gallate for a fluorescent material contains Ga, the light emission intensity at around a wavelength of 591 nm becomes higher in the light emission spectrum. In the composition of a rare earth aluminum-gallate for the fluorescent material, the parameter d indicating the amount of Ga is 0 or more and 0.85 or less, preferably 0.1 or more and 0.8 or less, more preferably 0.15 or more and 0.75 or less. In the composition of a rare earth aluminum-gallate for the fluorescent material, when the parameter d indicating the amount of Ga is 0.85 or less, the light emission intensity at around 591 nm can be higher in the light emission spectrum.

In a CIE1931 chromaticity coordinate system, the chromaticity of the emission color from the fluorescent material of the first embodiment of the present disclosure preferably falls within a range of $0.420 \leq x \leq 0.600$, and $0.300 \leq y \leq 0.530$, more preferably within a range of $0.450 \leq x \leq 0.590$, and $0.350 \leq y \leq 0.525$, even more preferably within a range of $0.480 \leq x \leq 0.580$, and $0.400 \leq y \leq 0.520$. In a CIE1931 chromaticity coordinate system, when the chromaticity x, y of the emission color from the fluorescent material falls within the above-mentioned range, the red component in the fluorescent material is reinforced and therefore the material provides light emission from a reddish orange color to a yellowing orange color. The emission color that the fluorescent material of an embodiment of the present disclosure gives as a result of photoexcitation in a region of near-ultraviolet to blue color, specifically as a result of absorption of light falling within a wavelength range of 380 nm or more and 485 nm or less, preferably falls within the above-mentioned range of x, y in a CIE1931 chromaticity coordinate system.

Method for Producing the Fluorescent Material Having a Composition of a Rare Earth Aluminum-Gallate As a method for producing the fluorescent material having a composition of a rare earth aluminum-gallate, the following method is exemplified.

In the method, respective raw materials including a compound containing at least one rare earth element Ln selected from the group consisting of Y, Gd, La, Lu, Sc and Sm, a compound containing at least one Group 13 element selected from Al and Ga, a compound containing Tb, a compound containing Ce and a compound containing Eu are mixed such that, when the total molar ratio of Al and Ga is set to 5, the total molar ratio of Ln, and Tb, Ce and Eu is 3, the molar ratio of Tb is a product of 3 and the parameter a, the molar ratio of Ce is a product of 3 and the parameter b, the molar ratio of Eu is the product of 3 and the parameter c, the molar ratio of Ga is the product of 5 and a parameter d, the parameter a is 0.25 or more and less than 1, preferably the parameter a is 0.25 or more and 0.9998 or less, the parameter b is $0.008 \times 10^{-2}$ or more and $1.5 \times 10^{-2}$ or less, the parameter c is $0.012 \times 10^{-2}$ or more and $2 \times 10^{-2}$ or less, and the parameter d is 0 or more and 0.85 or less, to give a raw material mixture, and this raw material mixture is heat-treated to give a fluorescent material having a composition of a rare earth aluminum-gallate.

Compound Containing a Rare Earth Element

Examples of the compound containing a rare earth element include an oxide, a hydroxide, a nitride, an oxynitride, a fluoride, and a chloride, each containing at least one rare earth element Ln selected from the group consisting of Y, Gd, La, Lu, Sc and Sm. Such a compound may be a hydrate. Among the compounds containing a rare earth element Ln, a metal simple substance or an alloy containing a rare earth element may also be used as at least a part thereof.

Specifically, the compound containing a rare earth element may include $Y_2O_3$, $Y(OH)_3$, YN, $YF_3$, $YCl_3$, $Gd_2O_3$, $Gd(OH)_3$, GdN, $GdF_3$, $GdCl_3$, $Lu_2O_3$, $LuF_3$, $LuCl_3$, $La_2O_3$, $La(OH)_3$, $LaF_3$, $LaCl_3$, $Sc_2O_3$, ScN, $ScF_3$, $ScCl_3$, $Sm_2O_3$, SmN, $SmF_3$, $SmCl_3$, etc. The compound containing a rare earth element may be used alone, or may be used in combination of two or more thereof. The compound containing a rare earth element is preferably an oxide. This is because, when compared to other materials, an oxide does not contain any other element than the desired composition of a rare earth aluminum-gallate.

Compound Containing at Least One Group 13 Element Selected from Al and Ga

Examples of the compound containing at least one Group 13 element selected from Al and Ga include an oxide, a hydroxide, a nitride, an oxynitride, a fluoride and a chloride each containing aluminum or gallium. Such a compound may be a hydrate. As the compound containing aluminum or gallium, an aluminum metal simple substance, a gallium metal simple substance, an aluminum alloy, or a gallium alloy may be used, and the metal simple substance or alloy may also be used in place of at least a part of the compound.

Specifically, the compound containing at least one Group 13 element selected from Al and Ga may include $Al_2O_3$, $Al(OH)_3$, AlN, AlON, $AlF_3$, $AlCl_3$, $Ga_2O_3$, $Ga(OH)_3$, GaN, $GaF_3$, and $GaCl_3$. The compound containing at least one Group 13 element selected from Al or Ga may be used alone, or may be used in combination of two or more thereof. The compound containing at least one Group 13 element selected from Al and Ga is preferably an oxide. The reason for this resides in the matter that, when compared to other materials, the oxide does not contain any other element than the desired composition of a rare earth aluminum-gallate, and the fluorescent material having a desired composition is readily obtainable. In addition, in the case of using a compound containing any other element than the desired composition, there is a case where a residual impurity element may exist in the resulting fluorescent material, and there is a concern that this residual impurity element becomes a killer element with respect to light emission, resulting in a remarkable reduction of the light emission intensity.

Compound Containing Tb

Examples of the compound containing Tb include an oxide, a fluoride, a chloride containing terbium. Such a compound may be a hydrate. As the compound containing terbium, a terbium metal simple substance or a terbium alloy may be used, and the metal simple substance or alloy may also be used in place of at least a part of the compound.

Specifically, the compound containing Tb includes $Tb_4O_7$, $TbF_3$, and $TbCl_3$. The compound containing Tb may be used alone, or may be used in combination of two or more thereof. The compound containing Tb is preferably an oxide. The reason for this resides in the matter that, when compared to other materials, an oxide does not contain any other element than the desired composition of a rare earth aluminum-gallate, and the fluorescent material having a desired composition is readily obtainable. In addition, in the case of using a compound containing any other element than the desired composition, there is a case where a residual impurity element may exist in the resulting fluorescent material, and there is a concern that this residual impurity element becomes a killer with respect to light emission, resulting in a remarkable reduction of the light emission intensity.

Compound Containing Ce

Examples of the compound containing Ce include an oxide, a hydroxide, a nitride, a fluoride, and a chloride, each containing cerium. Such a compound may be a hydrate. As the compound containing cerium, a cerium metal simple substance or a cerium alloy may be used, and the metal simple substance or alloy may also be used in place of at least a part of the compound.

Specifically, the compound containing Ce may include $CeO_2$, $Ce(OH)_2$, $Ce(OH)_4$, CeN, $CeF_3$, and $CeCl_3$. The compound containing Ce may be used alone, or may be used in combination of two or more thereof. The compound containing Ce is preferably an oxide. The reason for this resides in the matter that, when compared to other materials, an oxide does not contain any other element than the desired composition of a rare earth aluminum-gallate, and the fluorescent material having a desired composition is readily obtainable. In addition, in the case of using a compound containing any other element than the desired composition, there is a case where a residual impurity element may exist in the resulting fluorescent material, and there is a concern that this residual impurity element becomes a killer with respect to light emission, resulting in a remarkable reduction of the light emission intensity.

Compound Containing Eu

Examples of the compound containing Eu includes an oxide, a fluoride, and a chloride, each containing europium. Such a compound may be a hydrate. As the compound containing europium, an europium metal simple substance or an europium alloy may be used, and the metal simple substance or alloy may also be used in place of at least a part of the compound.

Specifically, the compound containing Eu may include $Eu_2O_3$, $EuF_3$, and $EuCl_3$. The compound containing Eu may be used alone, or may be used in combination of two or more thereof. The compound containing Eu is preferably an oxide. The reason for this resides in the matter that, when compared to other materials, an oxide does not contain any other element than the desired composition of a rare earth aluminum-gallate, and the fluorescent material having a desired composition is readily obtainable. In addition, in the case of using a compound containing any other element than the desired composition, there is a case where a residual impurity element may exist in the resulting fluorescent material, and there is a concern that this residual impurity element becomes a killer with respect to light emission, resulting in a remarkable reduction of the light emission intensity.

The raw material mixture may contain a flux, such as a halide or the like, as the need arises. When a flux is contained in the raw material mixture, the reaction among the raw materials is promoted, and a solid phase reaction is easy to advance more uniformly. In this regard, it may be considered that the temperature at which the raw material mixture is heat-treated is substantially the same as or higher than the formation temperature of a liquid phase of a halide or the like to be used as the flux, so that the reaction could be promoted.

Examples of the halide include fluorides, chlorides of a rare earth metal, an alkaline earth metal, or an alkali metal. In the case where a halide of a rare earth metal is used as a flux, the flux can also be added as the compound such that the product has a desired composition of a rare earth aluminum-gallate. Specifically, examples of the flux include barium fluoride ($BaF_2$), calcium fluoride ($CaF_2$), etc. The flux is preferably barium fluoride ($BaF_2$). This is because by using barium fluoride as the flux, the garnet crystal structure becomes stable, and a composition of the garnet crystal structure is readily formed.

In the case where the raw material mixture contains a flux, the content of the flux is preferably 20% by mass or less, more preferably 10% by mass or less, and preferably 0.1% by mass or more, on the basis of the raw material mixture (100% by mass). This is because when the content of the flux falls within the aforementioned range, the matter that the garnet crystal structure is hardly formed due to insufficient particle growth because of a small amount of the flux does not occur, and the matter that the garnet crystal structure is hardly formed because of an excessive amount of the flux does not also occur.

As for the raw material mixture, after weighing the respective raw materials in a desired blending ratio, for example, the raw materials may be ground and mixed using a dry grinder, such as a ball mill, a vibration mill, a hammer mill, a roll mill, a jet mill, etc.; may be ground and mixed using a mortar and a pestle, etc.; may be mixed using a mixing machine, for example, a ribbon blender, a Henschel mixer, a V type blender, etc.; or may be ground and mixed using both a dry grinder and a mixing machine. In addition, the mixing may be achieved by means of either dry mixing or wet mixing with addition of a solvent, etc. The mixing is preferably dry mixing. This is because, when compared to the wet mode, the dry mode enables the process time to be shortened, leading to an improvement in productivity.

The raw material mixture can be heat-treated by charging in a crucible, a boat made of, as a material, a carbon material, such as graphite etc., or boron nitride (BN), aluminum oxide (alumina), tungsten (w), or molybdenum (Mo).

From the viewpoint of stability of the crystal structure, the temperature at which the raw material mixture is heat-treated is preferably in a range of 800° C. or higher and 1800° C. or lower, more preferably 900° C. or higher and 1750° C. or lower, even more preferably 1000° C. or higher and 1700° C. or lower, and especially preferably 1100° C. or higher and 1650° C. or lower.

The heat treatment time varies depending upon a temperature elevation rate, a heat treatment atmosphere, and so on, and after reaching the heat treatment temperature, the heat treatment time is preferably 1 hour or more, more preferably 2 hours or more, and even more preferably 3 hours or more, and preferably 20 hours or less, more preferably 18 hours or less, and even more preferably 15 hours or less.

As for the atmosphere where the raw material mixture is heat-treated, the heat treatment can be performed in an inert atmosphere containing argon, nitrogen, or a reducing atmosphere containing hydrogen, etc., or an oxidizing atmosphere in the air, etc. It is preferred that the raw material mixture is heat-treated in a nitrogen atmosphere having reducing properties to give the fluorescent material. The atmosphere where the raw material mixture is heat-treated is more preferably an atmosphere containing hydrogen gas and nitrogen having reducing properties.

For the fluorescent material having a composition of a rare earth aluminum-gallate, the reactivity of the raw material mixture becomes good in an atmosphere having a high reducing power, such as a reducing atmosphere containing hydrogen and nitrogen, and can be heat-treated at atmospheric pressure without being pressurized. For the heat treatment, for example, an electric furnace, a gas furnace, and so on can be used.

The resulting fluorescent material may be wet dispersed and subjected to a post-treatment step, such as wet sieving, dehydration, drying, dry sieving, etc. According to such a post-treatment step, the fluorescent material having a desired average particle diameter is obtained. For example, the fluorescent material after the heat treatment is dispersed in a non-aqueous organic solvent or an aqueous solvent; a solvent flow is allowed to flow onto the dispersed fluorescent material on a sieve while applying a variety of vibrations via the sieve, thereby subjecting the calcined product to mesh passing to achieve wet sieving; and subsequently, dehydration, drying, and dry sieving are performed. There can be thus obtained the fluorescent material having a desired average particle diameter.

By dispersing the fluorescent material after the heat treatment in an aqueous medium, impurities, such as a calcination residue of the flux and unreacted components of the raw materials can be removed. For the wet dispersion, a dispersion medium, such as alumina balls, zirconia balls, etc. may be used.

Light Emitting Device

Next, a light emitting device utilizing the resulting fluorescent material as a constituent element of a wavelength conversion member is explained. The light emitting device of the second embodiment of the present disclosure includes at least fluorescent material of the first embodiment of the disclosure and an excitation light source.

For the excitation light source, a light emitting element can be used. The light emitting element is preferably one having a light emission peak wavelength in a wavelength range of 250 nm or more and 500 nm or less. The range of the light emission peak wavelength of the light emitting element is more preferably in a wavelength range of 350 nm or more and 490 nm or less, and even more preferably 380 nm or more and 485 nm or less, still more preferably 400 nm or more and 480 nm or less. By using such a light emitting element as the excitation light source, there can be provided a light emitting device having a combination of the fluorescent material of the first aspect of the invention that has a sharp and strong emission peak at around a wavelength of 591 nm in the light emission spectrum, and the excitation light source.

The full width at half maximum of the light emission spectrum of the light emitting element can be, for example, controlled to be 30 nm or less.

For the light emitting element, a semiconductor light emitting element using a nitride-based semiconductor ($In_XAl_YGa_{1-X-Y}N$, $0 \leq X$, $0 \leq Y$, $X+Y \leq 1$) is preferably used. By using a semiconductor light emitting element as the light source, a stable light emitting device which is high in efficiency, high in linearity of an output to an input, and strong against mechanical impact can be provided.

The fluorescent material which is included in the light emitting device is preferably a fluorescent material having the composition represented by the aforementioned formula (I). The fluorescent material which is included in the light emitting device is excited with light in a wavelength range of 250 nm or more and 500 nm or less. The light emitting device may be composed of, as a first fluorescent material, the aforementioned fluorescent material of the first embodiment of the disclosure, and may include, in addition to this first fluorescent material, a second fluorescent material, and a combination of plural kinds of fluorescent materials may be used as the second fluorescent material.

The fluorescent material of the first embodiment of the disclosure may be contained, for example, in a fluorescent member that covers an excitation light source, and may constitute the light emitting device. In the light emitting device, the excitation light source is covered with the fluorescent member containing the fluorescent material of the first embodiment of the disclosure, and a part of light emitted by the excitation light source is absorbed by the fluorescent material of the first embodiment of the disclosure, and consequently, light having a sharp and strong emission peak at around a wavelength of 591 nm is thereby emitted.

It is preferred that the light emitting device contains the second fluorescent material which is different in the light emission peak wavelength from the first fluorescent material. For example, when the light emitting device suitably includes the light emitting element, the first fluorescent material which is excited with this and has a sharp light emission peak having a high light emission intensity at around a wavelength of 591 nm, and the second fluorescent material which is different in the wavelength region to be emitted, light in a broad wavelength region can be emitted.

The second fluorescent material may be a fluorescent material capable of absorbing the light from the light emitting element and wavelength-converting it into light having a different wavelength. For example, the second fluorescent material is preferably at least any one or more selected from a nitride-based fluorescent material mainly activated with a lanthanide series element, such as Eu, Ce, etc.; an oxynitride-based fluorescent material; a sialon-based fluorescent material; an alkaline earth halogen apatite fluorescent material mainly activated with a lanthanide series element, such as Eu, etc., or a transition metal series element, such as Mn, etc.; an alkaline earth metal halogen borate fluorescent material; an alkaline earth metal aluminate fluorescent material; an alkaline earth silicate; an alkaline earth sulfide; an alkaline earth thiogallate; an alkaline earth silicon nitride; a germinate; a rare earth aluminate mainly activated with a lanthanide series element, such as Ce, etc.; a rare earth silicate; an organic material and an organic complex mainly activated with a lanthanide series element, such as Eu, etc. By using such a fluorescent material alone or in combination of two or more thereof together with the fluorescent material of the first aspect of the invention, blue, green, yellow, red, and so on, as well as color tints that are neutral colors thereof, such as blue-green, yellow-green, orange and others, can be realized in addition to white color.

The fluorescent material of the first embodiment of the disclosure can constitute a fluorescent member covering the light emitting element together with the second fluorescent material and a sealing resin, as the need arises. Examples of the resin which constitutes the fluorescent member may include thermosetting resins, such as a silicone resin inclusive of a modified silicone resin, an epoxy resin, etc.

The fluorescent member may further contain, in addition to the resin and the fluorescent material, a filler, a light diffusing material, and so on. For example, when containing a light diffusing material, the directivity from the light emitting element is mitigated, thereby enabling a viewing angle to be increased. Examples of the filler may include silica, titanium oxide, zinc oxide, zirconium oxide, alumina, etc.

The light emitting device of the second aspect of the present invention can be used in lighting systems and security systems.

The fluorescent material of the first embodiment of the disclosure can be used in a light emitting device that emits a red color by laser excitation, in addition to the light emitting device of the second embodiment of the disclosure.

EXAMPLES

The present invention is hereunder specifically described by reference to the following Examples and Comparative Examples. The present invention is not limited to these Examples.

Example 1

49.60 g of $Y_2O_3$, 274.95 g of $Tb_4O_7$, 0.66 g of $CeO_2$, 0.67 g of $Eu_2O_3$, 89.66 g of $Al_2O_3$, and 134.78 g of $Ga_2O_3$ were weighed as raw materials. To the raw materials, 22.00 g of $BaF_2$ was added as a flux. These raw materials were dry mixed for 1 hour with a ball mill to give a raw material mixture. The resulting raw material mixture was filled in an alumina crucible and heat-treated at 1500° C. for 10 hours. The heat treatment was performed in a nitrogen atmosphere containing a hydrogen gas having reducing properties. The resulting heat-treated product was made to pass through a sieve to give a fluorescent material having a composition of $(Y_{0.229}Tb_{0.768}Ce_{0.001}Eu_{0.002})_3(Al_{0.55}Ga_{0.45})_5O_{12}$.

Example 2

A fluorescent material having a composition of $(Y_{0.229}Tb_{0.767}Ce_{0.002}Eu_{0.002})_3(Al_{0.55}Ga_{0.45})_5O_{12}$ was obtained in the same manner as in Example 1, except for weighing and using 49.57 g of $Y_2O_3$, 274.79 g of $Tb_4O_7$, 0.66 g of $CeO_2$, 0.67 g of $Eu_2O_3$, 89.61 g of $Al_2O_3$, and 134.70 g of $Ga_2O_3$ as the raw materials.

Example 3

A fluorescent material having a composition of $(La_{0.229}Tb_{0.767}Ce_{0.002}Eu_{0.002})_3(Al_{0.55}Ga_{0.45})_5O_{12}$ was obtained in the same manner as in Example 1, except for weighing and using 68.78 g of $La_2O_3$, 264.24 g of $Tb_4O_7$, 0.63 g of $CeO_2$, 0.65 g of $Eu_2O_3$, 86.17 g of $Al_2O_3$, and 129.53 g of $Ga_2O_3$ as the raw materials.

Example 4

A fluorescent material having a composition of $(Y_{0.468}Tb_{0.528}Ce_{0.002}Eu_{0.002})_3(Al_{0.55}Ga_{0.45})_5O_{12}$ was obtained in the same manner as in Example 1, except for weighing and using 105.21 g of $Y_2O_3$, 196.45 g of $Tb_4O_7$, 0.69 g of $CeO_2$, 0.70 g of $Eu_2O_3$, 98.65 g of $Al_2O_3$, and 148.30 g of $Ga_2O_3$ as the raw materials.

Example 5

A fluorescent material having a composition of $Y_{0.228}Tb_{0.764}Ce_{0.006}Eu_{0.002})_3(Al_{0.8}Ga_{0.2})_5O_{12}$ was obtained in the same manner as in Example 1, except for weighing and using 52.64 g of $Y_2O_3$, 291.76 g of $Tb_4O_7$, 2.11 g of $CeO_2$, 0.72 g of $Eu_2O_3$, 138.95 g of $Al_2O_3$, and 63.82 g of $Ga_2O_3$ as the raw materials.

Comparative Example 1

230.50 g of $Y_2O_3$, 93.92 g of $Gd_2O_3$, 5.35 g of $CeO_2$, and 220.23 g of $Al_2O_3$ were weighed as raw materials. As a flux, 22.00 g of $BaF_2$ was added to the raw materials. These raw materials were dry mixed for 1 hour with a ball mill to give a raw material mixture. The resulting raw material mixture was filled in an alumina crucible and heat-treated at 1450° C. for 10 hours. The heat treatment was performed in a nitrogen atmosphere containing a hydrogen gas having reducing properties. The resulting heat-treated product was made to pass through a sieve to give a fluorescent material having a composition of $(Y_{0.788}Gd_{0.2}Ce_{0.012})_3Al_5O_{12}$.

Comparative Example 2

A fluorescent material having a composition of $(Y_{0.95}Ce_{0.017}Eu_{0.033})_3Al_5O_{12}$ was obtained in the same manner as in Example 1, except for weighing and using 293.48 g of $Y_2O_3$, 8.01 g of $CeO_2$, 15.89 g of $Eu_2O_3$, and 232.60 g of $Al_2O_3$ as the raw materials.

Comparative Example 3

A fluorescent material having a composition of $(Tb_{0.92}Ce_{0.01}Eu_{0.07})_3Al_5O_{12}$ was obtained in the same manner as in Example 1, except for weighing and using 349.01 g of $Tb_4O_7$, 3.49 g of $CeO_2$, 25.00 g of $Eu_2O_3$, and 172.50 g of $Al_2O_3$ as the raw materials.

Comparative Example 4

A fluorescent material having a composition of $(Y_{0.875}Tb_{0.119}Ce_{0.003}Eu_{0.003})_3(Al_{0.6}Ga_{0.4})_5O_{12}$ was obtained in the same manner as in Example 1, except for weighing and using 227.58 g of $Y_2O_3$, 52.06 g of $Tb_4O_7$, 1.21 g of $CeO_2$, 1.23 g of $Eu_2O_3$, 119.08 g of $Al_2O_3$, and 145.85 g of $Ga_2O_3$ as the raw materials.

The fluorescent materials of Examples 1 to 5 and Comparative Examples 1 to 4 were subjected to composition analysis and to measurement of relative light emission intensity and luminescent chromaticity, according to the methods mentioned below.

Composition Analysis

Composition analysis was performed according to an alkali fusion method using an ICP emission spectrophotometer (OPTIMA, manufactured by Perkin Elmer, Inc.).

Relative Light Emission Intensity (%)

Figure 1:
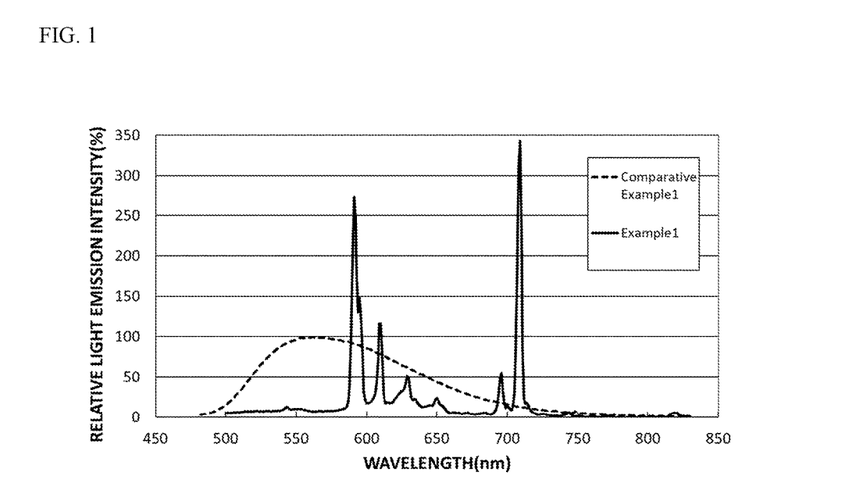
FIG. 1 is a diagram showing a light emission spectrum of the fluorescent material of Example 1 and a light emission spectrum of the fluorescent material of Comparative Example 1.
Figure 7:
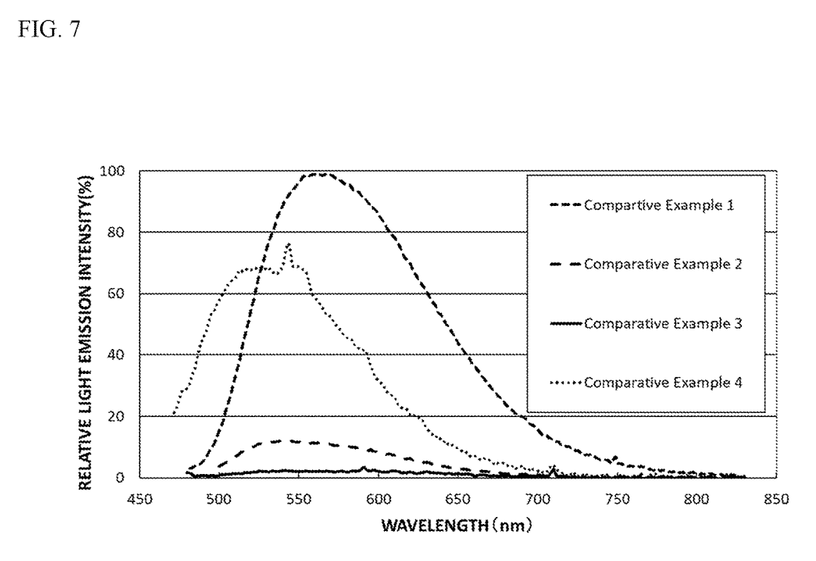
FIG. 7 is a diagram showing light emission spectra of the fluorescent materials of Comparative Examples 1 to 4.

With respect to the fluorescent materials of the Examples and Comparative Examples, light was applied at an excitation wavelength of 450 nm, and a relative light emission intensity (PL Intensity) (%) to the wavelength was measured at room temperature (25° C.±5° C.) with a spectrofluorophotometer (QE-2000, manufactured by Otsuka Electronics Co., Ltd.). With respect to the fluorescent materials of the Examples and Comparative Examples, the wavelength at which the light emission intensity is the highest in a wavelength region of 450 nm to 650 nm is referred to as the light emission peak wavelength (nm), and the light emission intensity at the light emission peak wavelength in Examples and Comparative Examples was expressed as a relative light emission intensity (%) relative to the light emission intensity at the light emission peak wavelength in Comparative Example 1, 100%. The results are shown in Table 1. FIG. 1 shows the light emission spectra in Example 1 and Comparative Example 1. FIG. 7 shows the light emission spectra in Comparative Examples 1 to 4.

Chromaticity (x, y) in CIE1931 Chromaticity Coordinate System

With respect to the fluorescent materials of the Examples and Comparative Examples, the chromaticity x, y was measured in a CIE1931 chromaticity coordinate system, using a quantum efficiency measuring apparatus (QE-2000, manufactured by Otsuka Electronics Co., Ltd.). The results are shown in Table 1.

Excitation Spectrometry

Figure 2:
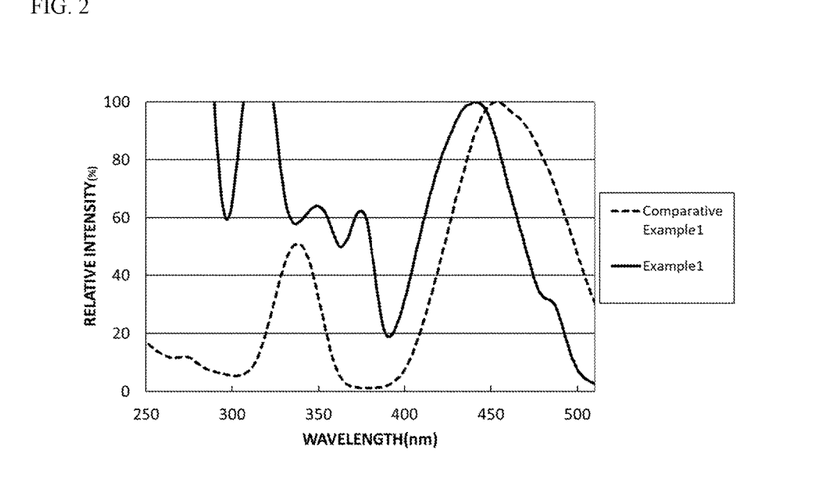
FIG. 2 is a diagram showing an excitation spectrum of the fluorescent material of Example 1 and an excitation spectrum of the fluorescent material of Comparative Example 1.
Figure 8:
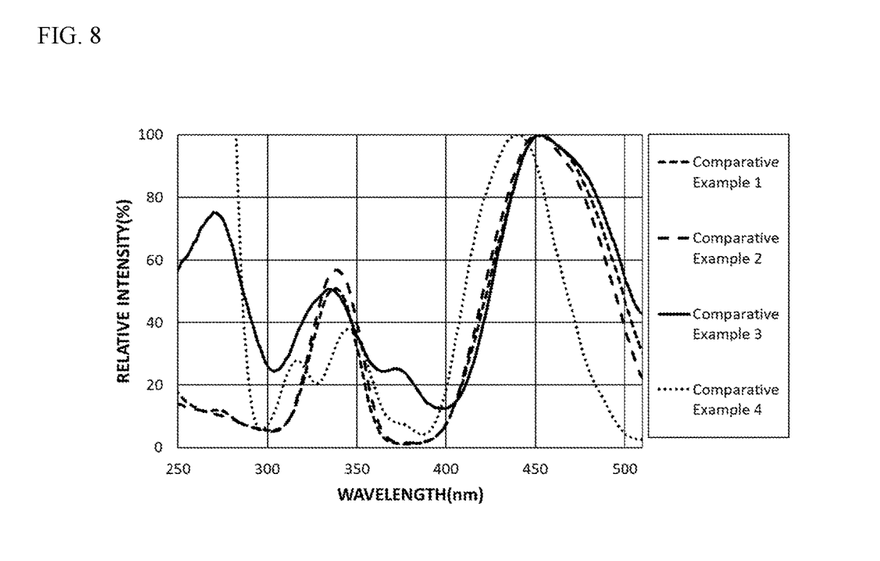
FIG. 8 is a diagram showing excitation spectra of the fluorescent materials of Comparative Examples 1 to 4.

With respect to the fluorescent materials of the Examples and Comparative Examples, the excitation spectrum of each fluorescent material was measured at the light emission peak wavelength thereof, at room temperature (25° C.±5° C.) and in a range of 250 nm or more and 510 nm or less, using a fluorescence spectrophotometer (product name: F-4500, manufactured by Hitachi High-Technologies Corporation). In the excitation spectrum pattern, the maximum intensity of the spectrum of each fluorescent material is referred to as 100%. FIG. 2 shows the excitation spectra in Example 1 and Comparative Example 1. FIG. 8 shows the excitation spectra in Comparative Examples 1 to 4.

As shown in FIG. 1, the fluorescent material of Example 1 gave a sharp and strong light emission peak at around a wavelength of 591 nm in the light emission spectrum. On the other hand, the fluorescent material of Comparative Example 1 had a peak top at around a wavelength of 562 nm, and gave a broad light emission peak in a range of 480 nm or more and 750 nm or less.

As shown in FIG. 2, it is confirmed that the fluorescent material of Example 1 had a relative intensity of 80% or more in a wavelength range of 400 nm or more and 480 nm or less, more specifically 420 nm or more and 460 nm or less, and efficiently absorbed the light from the excitation light source having a light emission peak wavelength of 380

TABLE 1

| | | Light Emission Peak Wavelength | Relative Light Emission Intensity | Chromaticity | |
|---|---|---|---|---|---|
| | Fluorescent Material Composition | (nm) | (%) | x | y |
| Example 1 | $(Y_{0.229}Tb_{0.768}Ce_{0.001}Eu_{0.002})_3(Al_{0.55}Ga_{0.45})_5O_{12}$ | 591 | 273 | 0.576 | 0.419 |
| Example 2 | $(Y_{0.229}Tb_{0.767}Ce_{0.002}Eu_{0.002})_3(Al_{0.55}Ga_{0.45})_5O_{12}$ | 591 | 247 | 0.554 | 0.438 |
| Example 3 | $(La_{0.229}Tb_{0.767}Ce_{0.002}Eu_{0.002})_3(Al_{0.55}Ga_{0.45})_5O_{12}$ | 591 | 236 | 0.553 | 0.439 |
| Example 4 | $(Y_{0.468}Tb_{0.528}Ce_{0.002}Eu_{0.002})_3(Al_{0.55}Ga_{0.45})_5O_{12}$ | 591 | 213 | 0.486 | 0.498 |
| Example 5 | $(Y_{0.228}Tb_{0.764}Ce_{0.006}Eu_{0.002})_3(Al_{0.8}Ga_{0.2})_5O_{12}$ | 591 | 110 | 0.454 | 0.522 |
| Comparative Example 1 | $(Y_{0.788}Gd_{0.2}Ce_{0.012})_3Al_5O_{12}$ | 562 | 100 | 0.463 | 0.522 |
| Comparative Example 2 | $(Y_{0.95}Ce_{0.017}Eu_{0.033})_3Al_5O_{12}$ | 538 | 12 | 0.425 | 0.556 |
| Comparative Example 3 | $(Tb_{0.92}Ce_{0.01}Eu_{0.07})_3Al_5O_{12}$ | — | — | — | — |
| Comparative Example 4 | $(Y_{0.875}Tb_{0.119}Ce_{0.003}Eu_{0.003})_3(Al_{0.6}Ga_{0.4})_5O_{12}$ | 543 | 76 | 0.345 | 0.561 |

As shown in Table 1, the fluorescent materials of Examples 1 to 5 each contain three lanthanoid elements of Tb, Ce and Eu, in which, therefore, a part of the rare earth element Ln constituting the garnet type crystal structure was substituted with the three lanthanoid elements Tb, Ce and Eu, and consequently, these fluorescent materials each gave a strong light emission peak at around a wavelength of 591 nm in the light emission spectrum thereof, as a result of receiving the light from the excitation light source, and therefore had a high relative light emission intensity. In addition, the fluorescent materials of Examples 1 to 5 each provided an emission color of such that the chromaticity x, y in a CIE1931 chromaticity coordinate system each fall within a range of 0.450≤x≤0.580 and 0.410≤y≤0.530, as a result of receiving the light from an excitation light source. The fluorescent materials of Examples 1 to 3 each provided an emission color having a strong red component. The fluorescent materials of Example 4 and Example 5 provided an emission color of orange having a strong yellowing tone.

For the fluorescent material of Comparative Example 1, x in a CIE1931 chromaticity coordinate system was 0.463 and y was 0.522, that is, the fluorescent material emitted a yellow color. The relative light emission intensity of the fluorescent material of Comparative Example 2 at a wavelength of 538 nm was 12% and was extremely low, and the fluorescent material emitted a yellow color light. The fluorescent material of Comparative Example 3 did not almost emit light, and the relative light emission intensity and the chromaticity thereof could not be measured. The relative light emission intensity of the fluorescent material of Comparative Example 4 at a wavelength of 543 nm was 76% and was low, and the fluorescent material emitted a yellowish green to yellow color light.

nm or more and 485 nm or less, and was thereby excited to give a high light emission intensity. In addition, as shown in FIG. 2, the fluorescent material of Comparative Example 1 had a relative intensity of 80% or more in a wavelength region of 400 nm or more and 480 nm or less, more specifically 430 nm or more and 480 nm or less, and absorbed the light from the excitation light source having a light emission peak wavelength of 380 nm or more and 485 nm or less.

Examples 6 to 10, and Comparative Example 5

Figure 3:
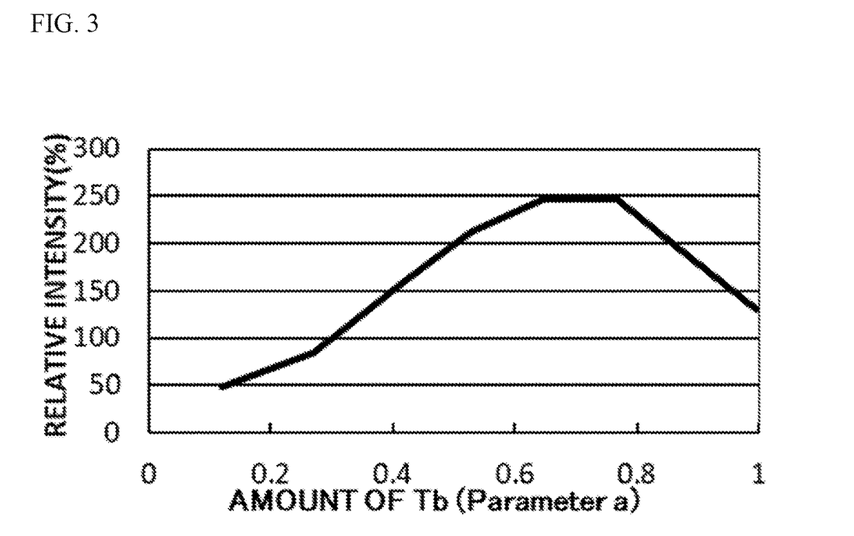
FIG. 3 is a graph showing a relative light emission intensity (%) at a wavelength of 591 nm of each fluorescent material relative to the amount of Tb (a parameter a) contained in each of the fluorescent materials of Example 2, Examples 6 to 10 and the fluorescent material of Comparative Example 5.

Garnet-structured fluorescent materials each having a composition of a rare earth aluminum-gallate were obtained in the same manner as in Example 1, except for using $Y_2O_3$, $Tb_4O_7$, $CeO_2$, $Eu_2O_3$, $Al_2O_3$, and $Ga_2O_3$ as raw materials and weighing the raw materials such that the parameter a, the parameter b, the parameter c and the parameter d could have the values shown in Table 2. The values of the parameter b and the parameter c in Table 2 are values calculated by multiplying the numerical values in Table 2 by $10^{-2}$. In the same manner as in Example 1, the light mission spectra of the fluorescent materials of Examples 6 to 10 and Comparative Example 5 and the relative light emission intensity (%) at a peak wavelength of 591 nm thereof were determined. The results in Example 2, Examples 6 to 10 and Comparative Example 5 are shown in Table 2. FIG. 3 is a graph showing a relative light emission intensity (%) at a wavelength of 591 nm of each fluorescent material relative to the parameter a in the composition of each fluorescent material.

TABLE 2

| | Tb Parameter a | Ce Parameter b (×10⁻²) | Eu Parameter c (×10⁻²) | Ga Parameter d | Peak Wavelength 591 nm Relative Light Emission Intensity (%) |
|---|---|---|---|---|---|
| Comparative Example 5 | 0.120 | 0.200 | 0.200 | 0.450 | 48 |
| Example 6 | 0.269 | | | | 85 |
| Example 7 | 0.418 | | | | 161 |
| Example 8 | 0.528 | | | | 213 |
| Example 9 | 0.647 | | | | 247 |
| Example 2 | 0.767 | | | | 247 |
| Example 10 | 0.996 | | | | 131 |

As shown in Table 2 and FIG. 3, in the case where the total molar ratio of the rare earth element Ln, and Tb and Ce and Eu is 3 and where the molar ratio of Tb is a product of 3 and the parameter a, based on the total molar ratio of Al and Ga in the composition of a rare earth aluminum-gallate of the fluorescent material, which is 5, the light emission intensity of the fluorescent material at around a wavelength of 591 nm was high when the parameter a was 0.25 or more and less than 1. As known from Example 2 and Examples 7 to 9, when the parameter a is 0.400 or more and 0.995 or less, the relative light emission intensity at around a wavelength of 591 nm was 150% or more and was higher. On the other hand, as known from Comparative Example 5, when the parameter a is less than 0.25, the relative light emission intensity at around a wavelength of 591 nm was less than 50% and was extremely low.

Examples 11 to 18, and Comparative Examples 6 to 8

Figure 4:
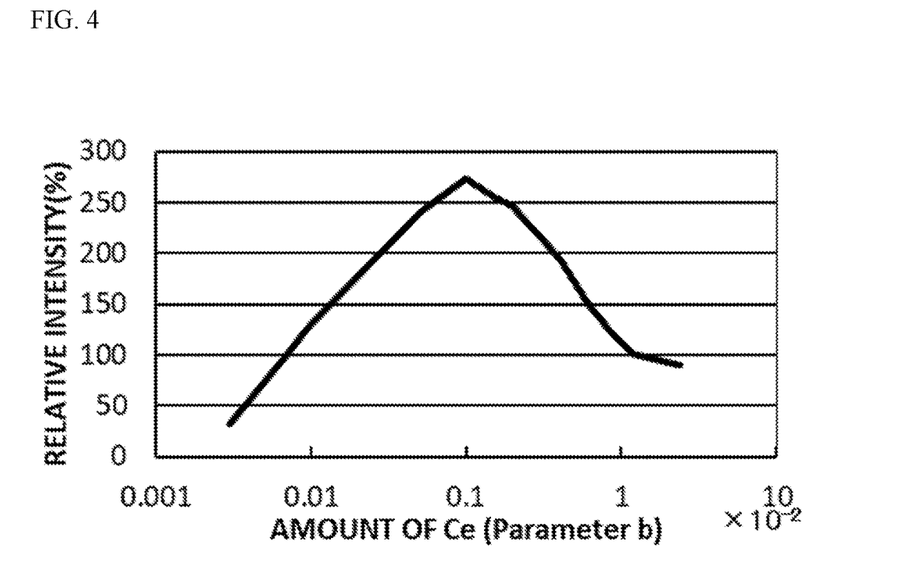
FIG. 4 is a graph showing a relative light emission intensity (%) at a wavelength of 591 nm of each fluorescent material relative to the amount of Ce (a parameter b) contained in each of the fluorescent materials of Example 2, Examples 11 to 18 and the fluorescent materials of Comparative Examples 6 to 8.

Garnet-structured fluorescent materials each having a composition of a rare earth aluminum-gallate were obtained in the same manner as in Example 1, except for using $Y_2O_3$, $Tb_4O_7$, $CeO_2$, $Eu_2O_3$, $Al_2O_3$, and $Ga_2O_3$ as raw materials and weighing the raw materials such that the parameter a, the parameter b, the parameter c and the parameter d could have the values shown in Table 3. The values of the parameter b and the parameter c in Table 3 are values calculated by multiplying the numerical values in Table 3 by $10^{-2}$. In the same manner as in Example 1, the light mission spectra of the fluorescent materials of Examples 11 to 18 and Comparative Examples 6 to 8 and the relative light emission intensity (%) at a peak wavelength of 591 nm thereof were determined. The results in Example 2, Examples 11 to 18 and Comparative Examples 6 to 8 are shown in Table 3. FIG. 4 is a graph showing a relative light emission intensity (%) at a wavelength of 591 nm of each fluorescent material relative to the parameter b in the composition of each fluorescent material.

TABLE 3

| | Tb Parameter a | Ce Parameter b (×10⁻²) | Eu Parameter c (×10⁻²) | Ga Parameter d | Peak Wavelength 591 nm Relative Light Emission Intensity (%) |
|---|---|---|---|---|---|
| Comparative Example 6 | 0.767 | 0.003 | 0.200 | 0.450 | 32 |
| Comparative Example 7 | | 0.007 | | | 100 |
| Example 11 | | 0.010 | | | 130 |
| Example 12 | | 0.050 | | | 240 |
| Example 13 | | 0.100 | | | 273 |
| Example 14 | | 0.150 | | | 256 |
| Example 2 | | 0.200 | | | 247 |
| Example 15 | | 0.400 | | | 195 |
| Example 16 | | 0.600 | | | 151 |
| Example 17 | | 0.900 | | | 118 |
| Example 18 | | 1.200 | | | 100 |
| Comparative Example 8 | | 2.400 | | | 90 |

As shown in Table 3 and FIG. 4, in the case where the total molar ratio of the rare earth element Ln, and Tb and Ce and Eu is 3 and where the molar ratio of Ce is a product of 3 and the parameter b, based on the total molar ratio of Al and Ga in the composition of a rare earth aluminum-gallate of the fluorescent material, which is 5, the light emission intensity of the fluorescent material at around a wavelength of 591 nm was high when the parameter b was $0.008 \times 10^{-2}$ or more and $1.5 \times 10^{-2}$ or less, preferably $0.01 \times 10^{-2}$ or more and $0.95 \times 10^{-2}$ or less, more preferably $0.015 \times 10^{-2}$ or more and $0.7 \times 10^{-2}$ or less. On the other hand, as in Comparative Examples 6 to 7, when the parameter b is less than $0.008 \times 10^{-2}$, or as in Comparative Example 8, when the parameter b is more than $1.5 \times 10^{-2}$, the relative light emission intensity at around a wavelength of 591 nm was not more than 100% and was low.

Examples 19 to 25 and Comparative Examples 9 to 10

Figure 5:
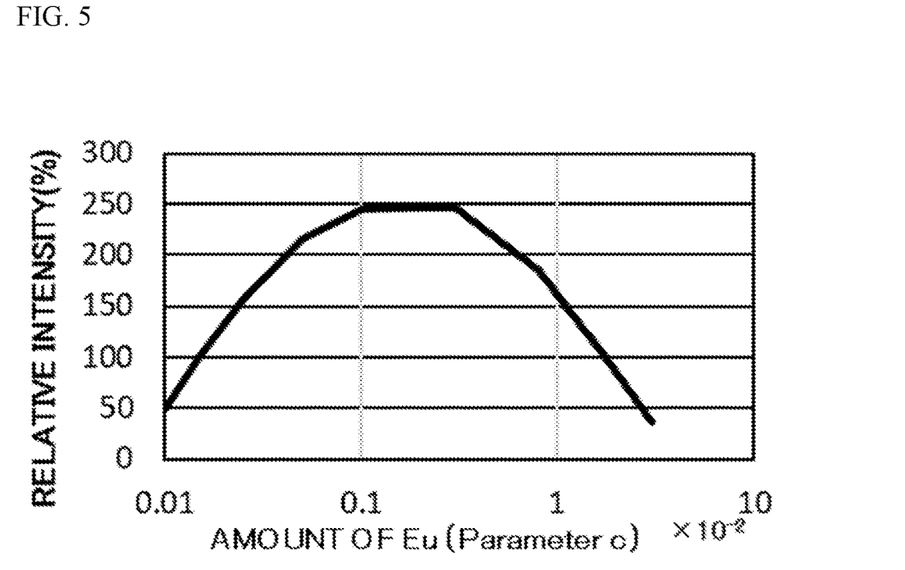
FIG. 5 is a graph showing a relative light emission intensity (%) at a wavelength of 591 nm of each fluorescent material relative to the amount of Eu (a parameter c) contained in each of the fluorescent materials of Example 2, Examples 19 to 25 and the fluorescent materials of Comparative Examples 9 to 10.

Garnet-structured fluorescent materials each having a composition of a rare earth aluminum-gallate were obtained in the same manner as in Example 1, except for using $Y_2O_3$, $Tb_4O_7$, $CeO_2$, $Eu_2O_3$, $Al_2O_3$, and $Ga_2O_3$ as raw materials and weighing the raw materials such that the parameter a, the parameter b, the parameter c and the parameter d could have the values shown in Table 4. The values of the parameter b and the parameter c in Table 4 are values calculated by multiplying the numerical values in Table 4 by $10^{-2}$. In the same manner as in Example 1, the light mission spectra of the fluorescent materials of Examples 19 to 25 and Comparative Examples 9 to 10 and the relative light emission intensity (%) at a peak wavelength of 591 nm thereof were determined. The results in Example 2, Examples 19 to 25 and Comparative Examples 9 to 10 are shown in Table 4. FIG. 5 is a graph showing a relative light emission intensity (%) at a wavelength of 591 nm of each fluorescent material relative to the parameter c in the composition of each fluorescent material.

TABLE 4

| | Tb Parameter a | Ce Parameter b (×10⁻²) | Eu Parameter c (×10⁻²) | Ga Parameter d | Peak Wavelength 591 nm Relative Light Emission Intensity (%) |
|---|---|---|---|---|---|
| Comparative Example 9 | 0.767 | 0.200 | 0.010 | 0.450 | 50 |
| Example 19 | | | 0.015 | | 100 |
| Example 20 | | | 0.025 | | 156 |
| Example 21 | | | 0.050 | | 216 |

TABLE 4-continued

| | Tb Parameter a | Ce Parameter b (×10$^{-2}$) | Eu Parameter c (×10$^{-2}$) | Ga Parameter d | Peak Wavelength 591 nm Relative Light Emission Intensity (%) |
|---|---|---|---|---|---|
| Example 22 | | | 0.100 | | 245 |
| Example 2 | | | 0.200 | | 247 |
| Example 23 | | | 0.300 | | 246 |
| Example 24 | | | 0.800 | | 185 |
| Example 25 | | | 1.600 | | 109 |
| Comparative Example 10 | | | 3.000 | | 36 |

As shown in Table 4 and FIG. 5, in the case where the total molar ratio of the rare earth element Ln, and Tb and Ce and Eu is 3 and where the molar ratio of Eu is a product of 3 and the parameter c, based on the total molar ratio of Al and Ga in the composition of a rare earth aluminum-gallate of the fluorescent material, which is 5, the light emission intensity of the fluorescent material at around a wavelength of 591 nm was high when the parameter c was 0.012×10$^{-2}$ or more and 2×10$^{-2}$ or less, preferably 0.014×10$^{-2}$ or more and 1.6×10$^{-2}$ or less, more preferably 0.02×10$^{-2}$ or more and 1.2×10$^{-2}$ or less. On the other hand, as in Comparative Example 9, when the parameter c is less than 0.012×10$^{-2}$, or as in Comparative Example 10, when the parameter c is more than 2×10$^{-2}$, the relative light emission intensity at around a wavelength of 591 nm was not more than 50% and was extremely low.

Examples 26 to 32, and Comparative Example 11

Figure 6:
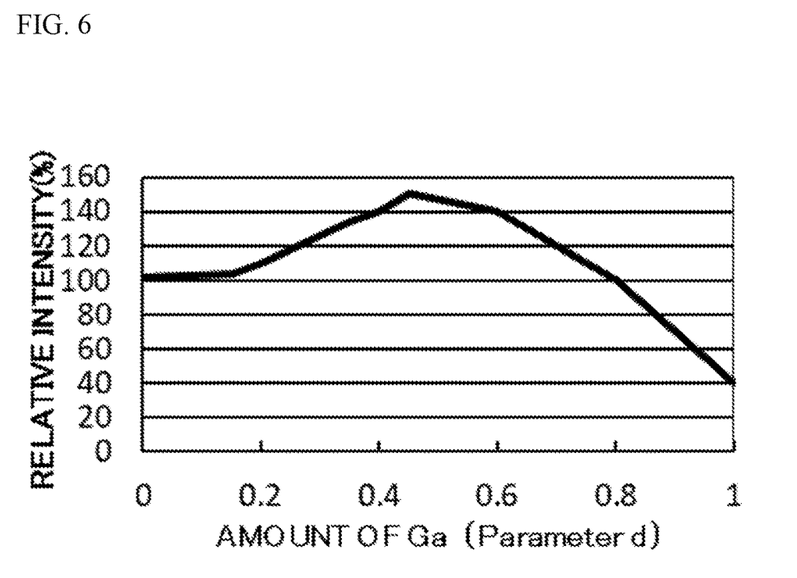
FIG. 6 is a graph showing a relative light emission intensity (%) at a wavelength of 591 nm of each fluorescent material relative to the amount of Ga (a parameter d) contained in each of the fluorescent materials of Example 5, Examples 26 to 32 and the fluorescent material of Comparative Example 11.

Garnet-structured fluorescent materials each having a composition of a rare earth aluminum-gallate were obtained in the same manner as in Example 1, except for using $Y_2O_3$, $Tb_4O_7$, $CeO_2$, $Eu_2O_3$, $Al_2O_3$, and $Ga_2O_3$ as raw materials and weighing the raw materials such that the parameter a, the parameter b, the parameter c and the parameter d could have the values shown in Table 5. The values of the parameter b and the parameter c in Table 5 are values calculated by multiplying the numerical values in Table 5 by 10$^{-2}$. In the same manner as in Example 1, the light mission spectra of the fluorescent materials of Examples 26 to 32 and Comparative Example 11 and the relative light emission intensity (%) at a peak wavelength of 591 nm thereof were determined. The results in Example 5, Examples 26 to 32 and Comparative Example 11 are shown in Table 5. FIG. 6 is a graph showing a relative light emission intensity (%) at a wavelength of 591 nm of each fluorescent material relative to the parameter d in the composition of each fluorescent material.

TABLE 5

| | Tb Parameter a | Ce Parameter b (×10$^{-2}$) | Eu Parameter c (×10$^{-2}$) | Ga Parameter d | Peak Wavelength 591 nm Relative Light Emission Intensity (%) |
|---|---|---|---|---|---|
| Example 26 | 0.764 | 0.600 | 0.200 | 0.000 | 102 |
| Example 27 | | | | 0.150 | 104 |
| Example 5 | | | | 0.200 | 110 |
| Example 28 | | | | 0.350 | 134 |
| Example 29 | | | | 0.400 | 140 |

TABLE 5-continued

| | Tb Parameter a | Ce Parameter b (×10$^{-2}$) | Eu Parameter c (×10$^{-2}$) | Ga Parameter d | Peak Wavelength 591 nm Relative Light Emission Intensity (%) |
|---|---|---|---|---|---|
| Example 30 | | | | 0.450 | 151 |
| Example 31 | | | | 0.600 | 140 |
| Example 32 | | | | 0.800 | 100 |
| Comparative Example 11 | | | | 1.000 | 40 |

As shown in Table 5 and FIG. 6, in the case where the total molar ratio of the rare earth element Ln, and Tb and Ce and Eu is 3 and where the molar ratio of Ga is a product of 5 and the parameter d, based on the total molar ratio of Al and Ga in the composition of a rare earth aluminum-gallate of the fluorescent material, which is 5, the light emission intensity of the fluorescent material at around a wavelength of 591 nm was high when the parameter d was 0 or more and 0.85 or less, preferably 0.1 or more and 0.8 or less, more preferably 0.15 or more and 0.75 or less. On the other hand, as in Comparative Example 11, when the parameter d is more than 0.85, the relative light emission intensity at around a wavelength of 591 nm was not more than 50% and was extremely low.

As shown in FIG. 7, the relative light emission intensity at a wavelength of 538 nm of the fluorescent material of Comparative Example 2 was 12% and was extremely low, and the light emission peak was a broad peak in a broad wavelength range of 500 nm or more and 650 nm or less. The fluorescent material of Comparative Example 3 gave an extremely low peak at around a wavelength of 591 nm, the relative light emission intensity thereof was less than 5%, that is, the fluorescent material almost did not emit light. The fluorescent material of Comparative Example 4 had a composition of a rare earth aluminum-gallate, in which, based on the total molar ratio of Al and Ga of 5, the total molar ratio of the rare earth element Ln, and Tb and Ce and Eu was 3 and the molar ratio of Tb was a product of 3 and the parameter a, but in which the parameter a was less than 0.25. The peak wavelength of the fluorescent material of Comparative Example 4, at which the light emission intensity thereof is the highest in a wavelength range of 450 nm to 650 nm, was 543 nm, and the relative light emission intensity thereof at the peak wavelength of 543 nm was 76%. That is, the light emission intensity of the fluorescent material of Comparative Example 4 is lower than that of the fluorescent materials of Examples 1 to 5.

As shown in FIG. 8, the fluorescent materials of Comparative Examples 1 to 4 all had a relative light emission intensity of 80% or more in a wavelength range of 400 nm or more and 480 nm or less, and efficiently absorbed the light from an excitation light source having a light emission peak wavelength of 380 nm or more and 485 nm or less, but these fluorescent materials had a low relative light emission intensity as shown in FIG. 7.

In accordance with an embodiment of the present invention, a fluorescent material having a composition of a rare earth aluminum-gallate having a high light emission intensity, and a light emitting device using the fluorescent material can be provided. The light emitting device can be used in lighting systems and sensor systems in security systems.

The invention claimed is:

1. A fluorescent material having a composition represented by the following formula (I):

(I)

wherein Ln represents at least one rare earth element selected from the group consisting of Y, Gd, La, Lu, Sc and Sm, and parameters a, b, c and d satisfy $0.25 \leq a < 1$, $0.008 \times 10^{-2} \leq b \leq 1.5 \times 10^{-2}$, $0.012 \times 10^{-2} \leq c \leq 2 \times 10^{-2}$, and $0 \leq d \leq 0.85$.

2. The fluorescent material according to claim 1, wherein the parameter a is 0.3 or more and less than 1, the parameter b is $0.01 \times 10^{-2}$ or more and $0.95 \times 10^{-2}$ or less, the parameter c is $0.014 \times 10^{-2}$ or more and $1.6 \times 10^{-2}$ or less, and the parameter d is 0.1 or more and 0.8 or less.

3. The fluorescent material according to claim 1, wherein the parameter a is 0.35 or more and less than 1, the parameter b is $0.015 \times 10^{-2}$ or more and $0.7 \times 10^{-2}$ or less, the parameter c is $0.02 \times 10^{-2}$ or more and $1.2 \times 10^{-2}$ or less, and the parameter d is 0.15 or more and 0.75 or less.

4. The fluorescent material according to claim 1, wherein the rare earth element Ln is at least one selected from the group consisting of Y, Gd, La, Lu and Sc.

5. The fluorescent material according to claim 1, wherein the chromaticity of an emission color of the fluorescent material falls within a range of $0.420 \leq x \leq 0.600$ and $0.300 \leq y \leq 0.530$ in a CIE1931 chromaticity coordinate system.

6. A light emitting device comprising the fluorescent material of claim 1, and an excitation light source.

7. The light emitting device according to claim 6, wherein the excitation light source has a light emission peak wavelength within a range of 380 nm or more and 485 nm or less.

* * * * *